United States Patent [19]

Otsuka

[11] Patent Number: 5,331,281

[45] Date of Patent: Jul. 19, 1994

[54] GRADIENT MAGNETIC FIELD GENERATING COIL ASSEMBLY OF MAGNETIC RESONANCE IMAGING APPARATUS

[75] Inventor: Masayuki Otsuka, Katsuta, Japan

[73] Assignee: Hitachi, Ltd., Tokyo, Japan

[21] Appl. No.: 937,711

[22] Filed: Sep. 1, 1992

[30] Foreign Application Priority Data

Sep. 4, 1991 [JP] Japan ................... 3-224347

[51] Int. Cl.⁵ .......................................... G01R 33/20
[52] U.S. Cl. .................... 324/318; 324/300
[58] Field of Search ................ 324/318, 322, 300; 335/296, 297, 298

[56] References Cited

U.S. PATENT DOCUMENTS

| | | | |
|---|---|---|---|
| 4,712,067 | 12/1987 | Roschmann et al. | 324/318 |
| 4,755,754 | 7/1988 | Sireul et al. | 324/318 |
| 4,878,023 | 10/1989 | Overweg et al. | 324/318 |
| 4,879,515 | 11/1989 | Roemer et al. | 324/318 |
| 4,978,920 | 12/1990 | Mansfield et al. | 324/318 |
| 5,012,191 | 4/1991 | Siebold et al. | 324/318 |
| 5,028,872 | 7/1991 | Nakabayashi | 324/318 |
| 5,083,085 | 1/1992 | Morad | 324/318 |
| 5,084,676 | 1/1992 | Saho et al. | 324/322 |

FOREIGN PATENT DOCUMENTS

| | | |
|---|---|---|
| 59-216045 | 12/1984 | Japan . |
| 63-158046 | 7/1988 | Japan . |
| 1-201242 | 8/1989 | Japan . |
| 3-261454 | 11/1991 | Japan . |
| 3-284244 | 12/1991 | Japan . |

*Primary Examiner*—Michael J. Tokar
*Assistant Examiner*—Raymond Y. Mah
*Attorney, Agent, or Firm*—Fay, Sharpe, Beall, Fagan, Minnich & McKee

[57] ABSTRACT

A gradient magnetic field-generating coil assembly of MR imaging apparatus has a cylindrical core member for carrying coil windings that is divided into at least two cores at a central portion of a magnet bore, a gap is set up between the two cores at the central portion of the magnet bore and each core is provided at its opposite ends with parts for fixing it to the magnet, whereby the natural vibration frequency of the core can be deviated from an exciting force frequency and sound prevailing in the outside of the core and sound in the inside can be brought into interference with each other to thereby suppress vibration of the cores at the central portion of the magnet bore and reduce noise.

15 Claims, 8 Drawing Sheets

GRADIENT MAGNETIC FIELD GENERATING COIL ASSEMBLY OF MAGNETIC RESONANCE IMAGING APPARATUS

BACKGROUND OF THE INVENTION

The present invention relates to a gradient magnetic field generating coil assembly of a magnetic resonance (MR) imaging apparatus, and more particularly to a gradient magnetic field-generating coil assembly of an MR imaging apparatus having a function of extracting information about the position of a tomographic image and a construction effective to reduce noise.

In a conventional gradient magnetic field-generating coil assembly of an MR imaging apparatus, a core having substantially the same axial length as a magnet for generation of a static magnetic field and made of synthetic resin (especially FRP) is provided, a lap winding of coils corresponding to X, Y and Z axes, respectively, is wound on the core and the coils are held by a coil fixing plate made of metal or synthetic resin. When the gradient magnetic field-generating coil assembly having the above construction is driven by a constant-current driven power amplifier, a strong electromagnetic force is exerted on the coils instantaneously to cause them to vibrate, the vibration is transmitted to the cylindrical core via the coil fixing part to generate noise by hitting the core, and at the same time the transmitted vibration causes a natural vibration of an annulus of the core so as to generate resonant sound, leading to simultaneous occurrence of a cavity resonance inside the cylinder.

A prior art apparatus contrived to solve the above problems is disclosed in Japanese Patent Application No. JP-A-58-89147. In the apparatus disclosed in this literature, a cylindrical core is formed with many perforations to take the form of a basket. With this construction, the inside and outside of the winding join together spatially through the perforations, with the result that a sound wave prevailing in the outside passes through the perforations to interfere with a 180° dephased sound wave prevailing in the inside to thereby reduce developing noise.

However, because of the structure of the basket-like cylindrical core, it is very difficult to design a core of this type which can have sufficient mechanical strength to prevent deformation of the core due to the weight of the coils and the resulting electromagnetic force, and which can maintain sufficient mechanical strength to suppress vibratory displacement of the coils. In addition, employed for making the basket-like cylindrical core is either a method of boring a cylindrical core or a method of putting together short cylindrical cores or plates and assembling and bonding them. Any of these methods require much labor and much labor time and are very difficult to actually practice.

SUMMARY OF THE INVENTION

An object of the invention is to provide an inexpensive, safe and highly reliable gradient magnetic field-generating coil assembly for use in an MR imaging apparatus which can reduce vibration and noise, and which can be easy to manufacture while being highly practicable.

The gradient magnetic field-generating coil assembly according to the invention comprises three gradient magnetic field coils provided in a cavity of a bore of a magnet for generation of a static magnetic field in correspondence with three mutually orthogonal X, Y and Z axes, and is adapted to generate uniform gradient magnetic fields in the directions of the X, Y and Z axes. These three gradient magnetic field coils are carried on a cylindrical core member, featuring three points as below.

In the first place, the core member is divided into at least two cores at a central portion of the magnet bore so that the natural vibration frequency may shift to a higher one of each divisional cylindrical core. Then, each cylindrical core has a natural vibration frequency which is determined by equations (1) to (3).

$$f = \frac{1}{2\pi R^2} \sqrt{\frac{Egh^2}{12\gamma(1-v^2)}\left((n^2+k^2)^2 + \frac{ak^4}{(n^2+k^2)^2}\right)} \quad (1)$$

in which $$a = \frac{12(1-v^2)R^2}{h^2} \quad (2)$$

$$k = \frac{m\pi R}{l} \quad (3)$$

where h is the core thickness, R is the cylinder radius, l is the length, E is the modulus of longitudinal elasticity, $\gamma$ is the specific weight, $v$ is the Poisson's ratio and n is the wave number in the cylinder length direction.

The reason for dividing the core member is as follows. In the MR imaging apparatus, the timing for applying the gradient magnetic fields is changed in order to change the kind of imaged picture. When the pulse sequence of only the gradient magnetic field is observed in terms of frequency band, it proves to amount to 1 KHz or less in many applications. Accordingly, resonant sound will not occur if the dominant natural vibration frequency of each cylindrical core is set to 1 KHz or more. Conventionally, the gradient magnetic field-generating coil assembly has a length equal to the lateral width of the magnet and its dominant natural vibration frequency is about 500 Hz. Equations (1) to (3) indicate that even when the length is simply halved, the natural vibration frequency is increased by about four times, demonstrating that it is very easy for each of the two divisional cores to be so designed as to have a dominant natural vibration frequency of more than 1 KHz. By virtue of this construction, the whole system comprised of the cores and coils can be prevented from being brought into resonance with the pulse sequence of the gradient magnetic field. The number of divisional cores is not limited to two and similar effects can be attained even when the core member is divided into more than two.

Furthermore, a gap is set up between the cores so that sound generated inside of the core and sound generated outside thereof may interfere with each other to attenuate the inside sound. When the coils force air into the core, there occurs a sound wave inside the cylindrical core and, concurrently, a wave in 180° anti-phase relation with the inside wave is generated outside the cylindrical core. By causing the anti-phase sound to be diffracted at the gap formed between the two cores and to go around the gap into the inside of the core, the two sound waves interfere with each other to weaken sound pressure. At that time, reduced sound due to the interfere of the two sound waves occurs at a central portion of the magnet bore where ears of a patient whose head is being imaged are located, thus further enhancing the effect of reducing noise.

Also, each of the divisional cores is fixedly supported in such a way that its vibration can be minimized. By virtue of this construction, the core is not apt to be deformed by vibration which instead escapes toward the magnet to suppress the occurrence of sound.

DESCRIPTION OF THE PREFERRED EMBODIMENTS

Preferred embodiments of the present invention will now be described with reference to FIGS. 1 to 15.

Figure 1:
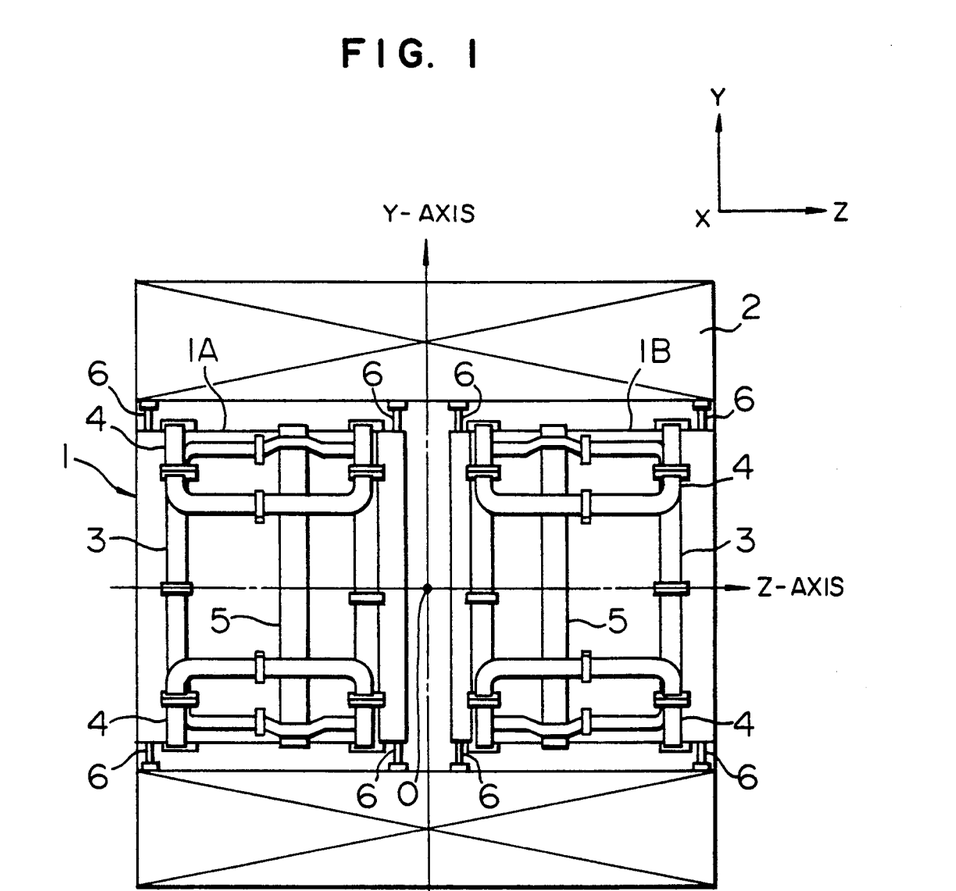
FIG. 1 is a longitudinal sectional view of a gradient magnetic field-generating coil assembly and a magnet for MR imaging apparatus, showing an embodiment of the invention.

In an MR imaging apparatus, a gradient magnetic field-generating coil assembly is adapted to acquire information about the position of an image and it generates, in directions of three axes X, Y and Z, magnetic fields each of which changes in intensity uniformly and linearly. The gradient magnetic field generating coil assembly 1 is disposed in a cavity of a bore formed in a magnet 2. A static magnetic field generated by the magnet 2 in the bore cavity is directed in the bore axis direction (Z-axis directions, i.e. the longitudinal axis). The gradient magnetic field-generating coil assembly 1 is comprised of a plurality of coil winding and a cylindrical core member for carrying these coil windings. According to the invention, the core member of the gradient magnetic field-generating coil assembly is divided bilaterally at the center O of the magnet bore into two cores 1A and 1B as shown in FIG. 1. Coils carried on each of the cores 1A and 1B are two X coils 3 arranged symmetrically with respect to the YZ plane, two Y coils 4 arranged symmetrically with respect to the XZ plane and a Z coil 5 in the form of a cylindrical coil which generates a magnetic field in the Z-axis direction.

The cores 1A and 1B each carrying the X, Y and Z coils are bilaterally symmetrical with respect to the center of the magnet bore to form a gap of a necessary distance between the cores 1A and 1B. Through the gap formed between the two cores, outside and inside spaces of each core 1A or 1B can join together. Each of the cores 1A and 1B is provided at its opposite ends with metal fittings 6 by which it is fixed to the magnet 2. Plural metal fittings 6 are arranged at the circumferential edge of each opening of the core 1A or 1B so as to extend radially.

A radio frequency coil is disposed inside the gradient magnetic field coil 1, though not shown.

The above construction is effective to provide the function of shifting the natural vibration frequency of each core 1A or 1B to a higher frequency at which the exciting force is weakened, the function of diffracting anti-phase sound prevailing in the outside of the cylindrical core to the inside thereof so that inside sound may interfere with outside sound and may be cancelled out, the function of making the core immune to deformation due to its vibration at the central portion of the magnet bore and the function of letting vibration of the core at the central portion of the magnet bore escape toward the magnet. On the basis of the above four functions, noise caused during the generation of gradient magnetic fields can be reduced.

Figure 2:
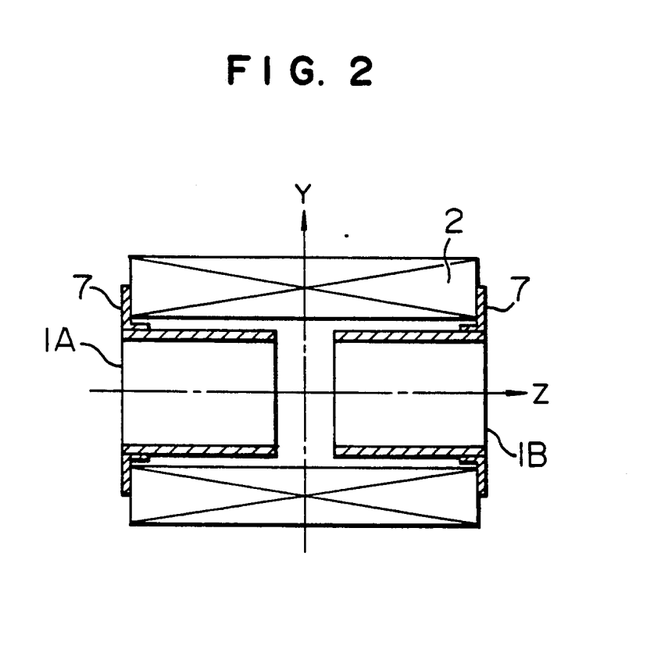
FIG. 2 is a longitudinal sectional view of an essential part of a gradient magnetic field-generating coil assembly and an MR imaging apparatus magnet, showing another embodiment of the invention.

FIG. 2 shows another embodiment of the fixing structure of each core. When the core 1A or 1B cannot be fixed and supported at the central portion of the magnet bore, fixtures 7 for each core are disposed near the opening end of the magnet 2 to cantilever the core as in the present embodiment. In this embodiment, however, each core is required to have very high rigidity.

Figure 3:
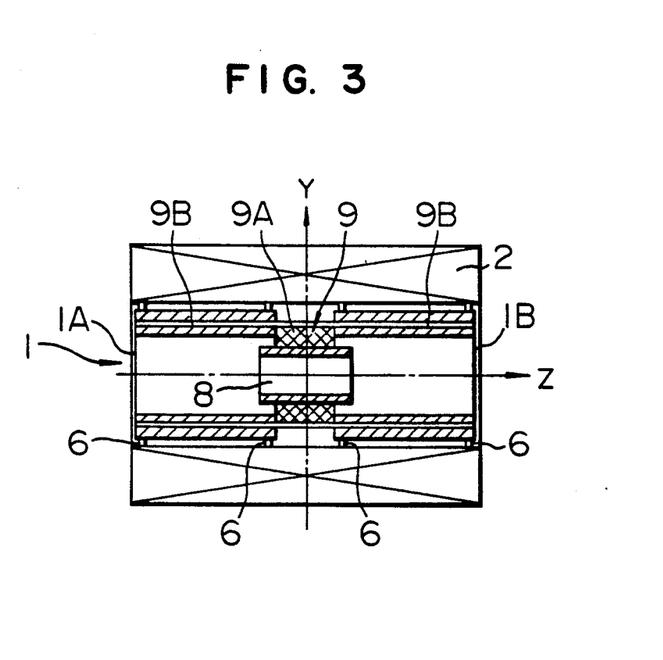
FIG. 3 is a longitudinal sectional view similar to FIG. 2 and showing another embodiment of the invention.

FIG. 3 shows another embodiment of the invention. In the MR imaging apparatus, an electrostatic shield 9 is used generally to prevent electrostatic coupling between the gradient magnetic field-generating coil assembly 1 and a radio frequency generating coil 8. In the present embodiment, a highly conductive, non-magnetic metal mesh is used as the electrostatic shield and disposed to bridge the gap between the cores 1A and 1B. In particular, a cylindrical electrostatic shield portion arranged in the gap between the two cores is designated by 9A. Since the portion 9A is made of a mesh-like shield material, the sound reduction effect resulting from diffraction and interference of sound prevailing in the outside of the core is not impaired. In order to provide an electrostatic shield for the cores 1A and 1B, each core has a two-layer structure as seen in FIG. 3 in which an intermediate layer serving as electrostatic shield 9B is buried between inner and outer core layers. Thus, the electrostatic shield 9 is generally formed of the portions 9A and 9B which are formed integrally with each other.

Figure 4:
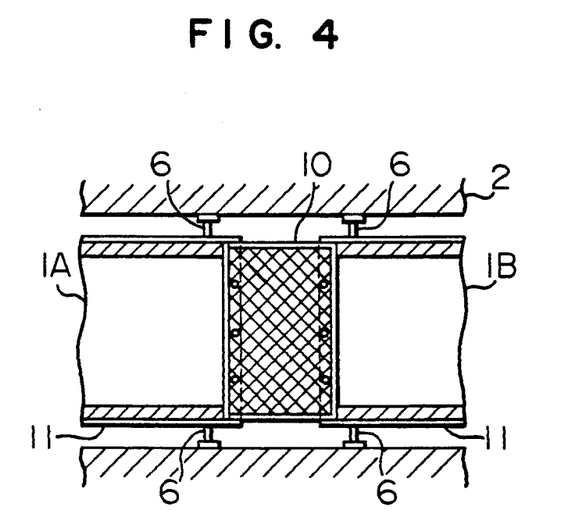
FIG. 4 is a fragmentary longitudinal sectional view similar to FIG. 2 and showing still another embodiment of the invention.

FIG. 4 shows still another embodiment of the invention. In the present embodiment, a separate cylindrical electrostatic shield 10 is first arranged in the gap between the cores 1A and 1B and thereafter it is joined, in the magnet bore cavity, to an electrostatic shield 11 separately provided on the entire outer periphery of each of the cores 1A and 1B. The electrostatic shields 10 and 11 are made of a highly conductive, non-magnetic metal mesh and are coupled with each other by bolts and the like.

Figure 5:
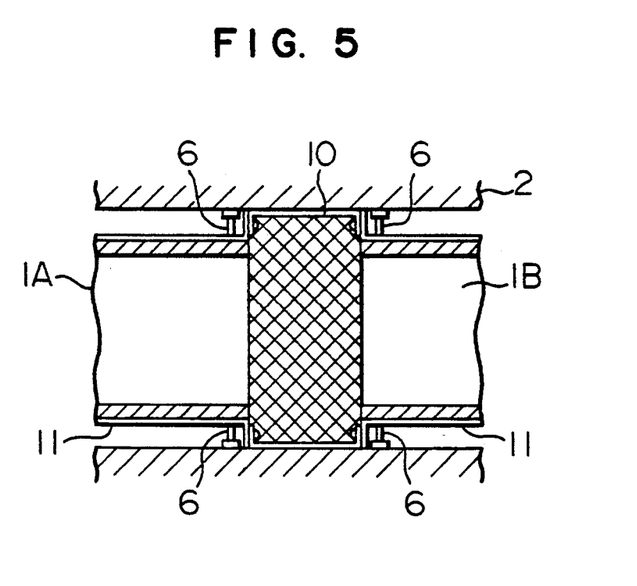
FIG. 5 is a fragmentary longitudinal sectional view similar to FIG. 2 and showing still another embodiment of the invention.

The construction of this embodiment can be modified as shown in FIG. 5. More particularly, in the modification, the cylindrical electrostatic shield 10 is increased in diameter and mounted at a location which is remote from the radio frequency generating coil 8. Consequently, the loss of radio frequency energy radiated from the radio frequency generating coil which is caused by energy leaking through a storage capacitor to the electrostatic shield and being consumed therein can be reduced.

Figure 6:
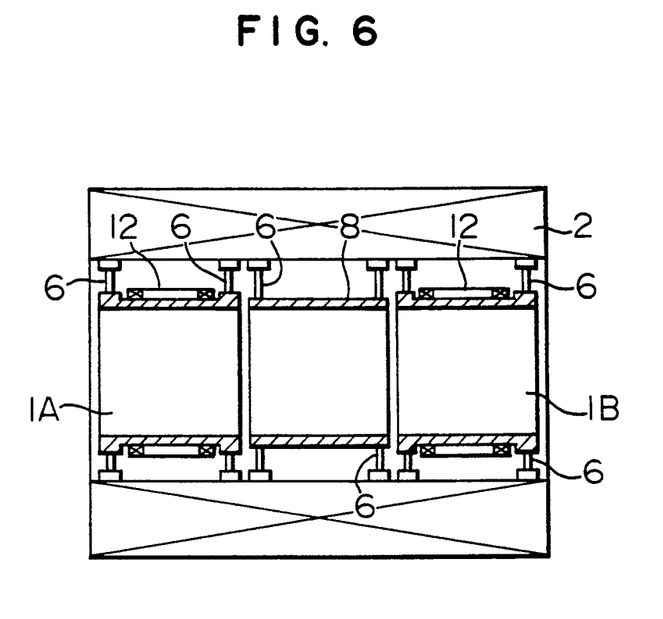
FIG. 6 is a longitudinal sectional view similar to FIG. 2 and showing still another embodiment of the invention.

FIG. 6 shows still another embodiment of the invention. Elements which are substantially identical to those described in the foregoing embodiments are designated by identical reference numerals. The present embodiment is structurally identical to each of the foregoing embodiments in that a space (gap) is formed contiguously to the opposing ends of the two bilateral divisional cores 1A and 1B and sound is diffracted at the space. In the present embodiment, a cylindrical radio frequency generating coil 8 having an increased diameter is particularly arranged in the gap portion. The radio frequency generating coil 8 is made to have the same diameter as that of the cores 1A and 1B which are positioned on both sides of the coil. A necessary gap is defined between each coil 1A or 1B and the radio frequency generating coil 8 to attain the same effect as in the case of the foregoing embodiments, that is, the effect of reducing noise.

With the construction of this embodiment, the radio frequency generating coil plugs the gap to improve the visible external appearance of an apparatus portion exposed to the cavity in which a patient to be imaged is placed and to raise the utilization efficiency of the cavity of the magnet bore. The two cores 1A and 1B and radio frequency generating coil 8 are fixedly supported within the bore of magnet 2 in the same way as that for the foregoing embodiments, that is, by means of metal fittings 6 arranged on the outer peripheries of the cores and the coil at their opposite ends. Obviously, coil windings 12 for generating gradient magnetic fields are carried on each of the cores 1A and 1B as in the case of the foregoing embodiments.

Figure 7:
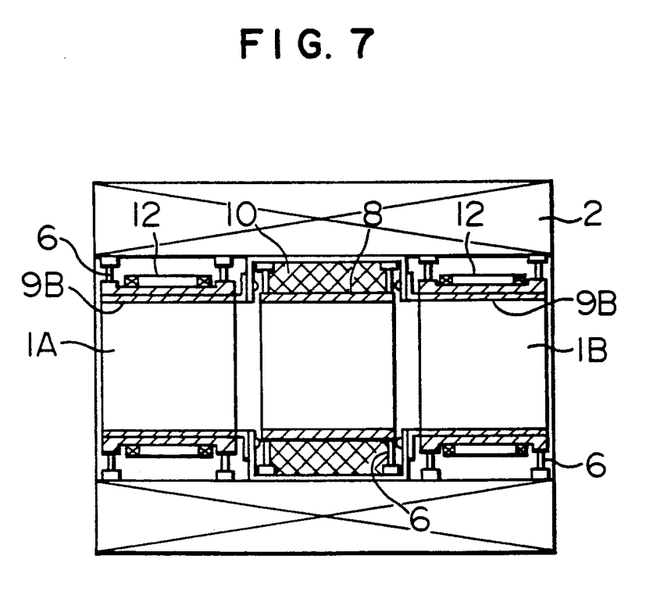
FIG. 7 is a longitudinal sectional view similar to FIG. 2 and showing a further embodiment of the invention.

FIG. 7 shows a further embodiment of the invention. In the present embodiment, the electrostatic shield as explained in connection with FIG. 5 is applied to the construction described with reference to FIG. 6. Identical elements to those described in the foregoing embodiments are designated by identical reference numerals.

Referring to FIG. 7, reference numeral 8 designates a radio frequency generating coil having an increased diameter, 10 an electrostatic shield having an increased diameter and 9B another electrostatic shield buried in each of the cores 1A and 1B. The electrostatic shields 9B and 10 are connected together at their opposing ends. Each core 1A and 1B and the radio frequency generating coil 8 are fixedly supported within the magnet bore by means of a plurality of metal fittings 6. A necessary gap is defined between each core 1A or 1B and the radio frequency generating coil 8 to attain the effect of reducing noise as in the foregoing embodiment.

Figure 8:
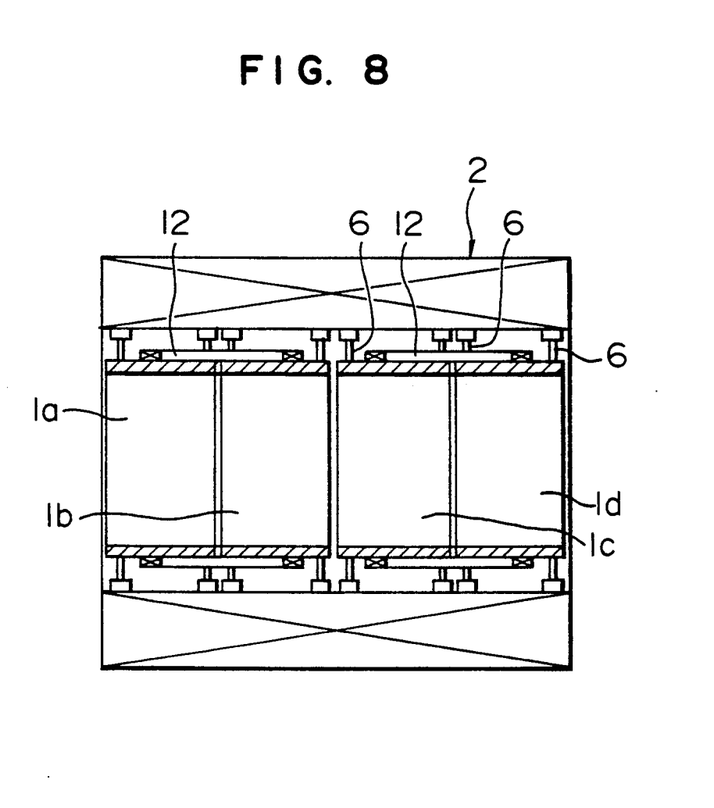
FIG. 8 is a longitudinal sectional view similar to FIG. 2 and showing a modified embodiment of the invention.

FIG. 8 shows a modified embodiment of the invention. In the present embodiment, the number of divisional cores of the gradient magnetic field-generating coil assembly is increased. As shown in FIG. 8, the coil assembly is divided into four cores. In contrast to the two divisional cores 1A and 1B used in the foregoing embodiments, each of the cores 1A and 1B is further divided into two cores which are designated by 1a, 1b, 1c and 1d. The ultimate divisional cores are fixedly supported by means of metal fittings 6. The fixing structure using the metal fittings 6 is the same as that described with reference to FIG. 1. The cores 1a and 1b are put together to provide a set and gradient magnetic field-generating coil windings 12 are carried on the outer periphery of the set and, similarly, the cores 1c and 1d are put together to provide a set and coil windings 12 are carried on the outer periphery of the set. With the above construction, the windings 12 do not cover all of the gaps between cores to leave behind a gap through which the inside and outside of the gradient magnetic field-generating coil assembly can join together, thus attaining a similar sound reduction effect to that explained in connection with the first embodiment described previously.

Figure 9:
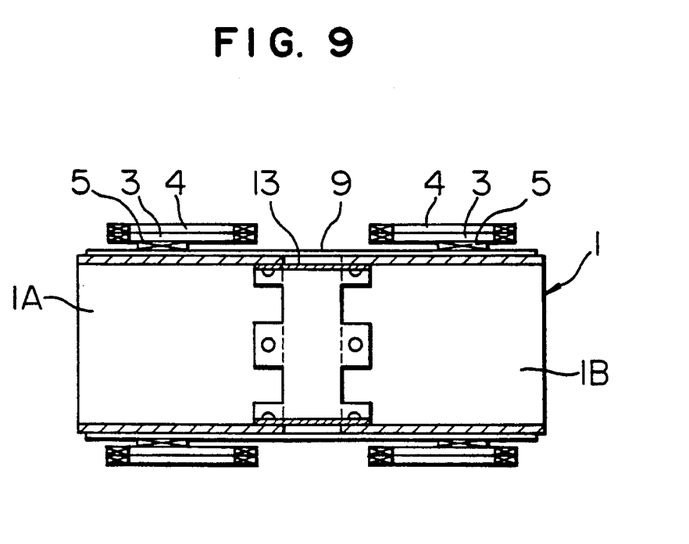
FIG. 9 is a longitudinal sectional view useful to explain a method of assembling and adjusting the gradient magnetic field generating coil assembly of the invention.
Figure 10:
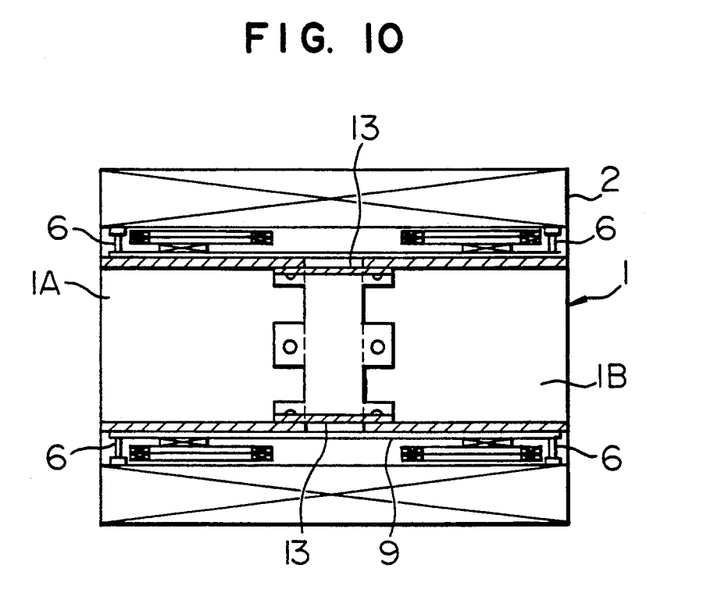
FIG. 10 is a longitudinal sectional view similar to FIG. 9.
Figure 11:
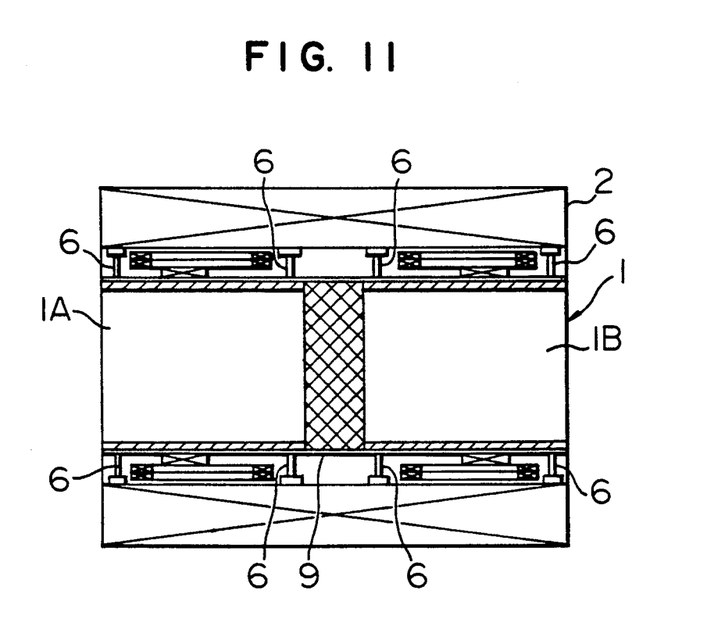
FIG. 11 is a longitudinal sectional view similar to FIG. 9.

FIGS. 9 to 11 show the procedure for assembling and adjusting a gradient magnetic field coil assembly 1 which is substantially the same as that explained with reference to FIG. 3. Problems encountered in practicing the assemblage are degradation of the linearity of the gradient magnetic field due to offset between the center axes of the cores 1A and 1B which is caused when the cores are assembled and adjusted within the cavity of magnet 2, and damage or fracture of the electrostatic shield 9 if it is employed.

In order to prevent the above problems, fabrication of the gradient magnetic field-generating coil assembly 1 and assemblage and adjustment of the assembly within the magnet 2 are carried out while the cores 1A and 1B are united by means of a coupling jig 13 mounted across the cores 1A and 1B, as shown in FIGS. 9 and 10. After completion of centering adjustment for making the center of the static magnetic field coincident with that of the gradient magnetic field, the gradient magnetic field-generating coil assembly 1 comprised of the cores and coils is completely fixed within the bore of magnet 2 by means of the plural metal fittings 6 and thereafter the coupling jig 13 is removed as will be seen in FIG. 11. Through this procedure, misalignment of the center axes of cores 1A and 1B can be avoided and damage of the electrostatic shield 9 can be prevented from occurring even if it is employed as shown in FIG. 3.

Figure 12:
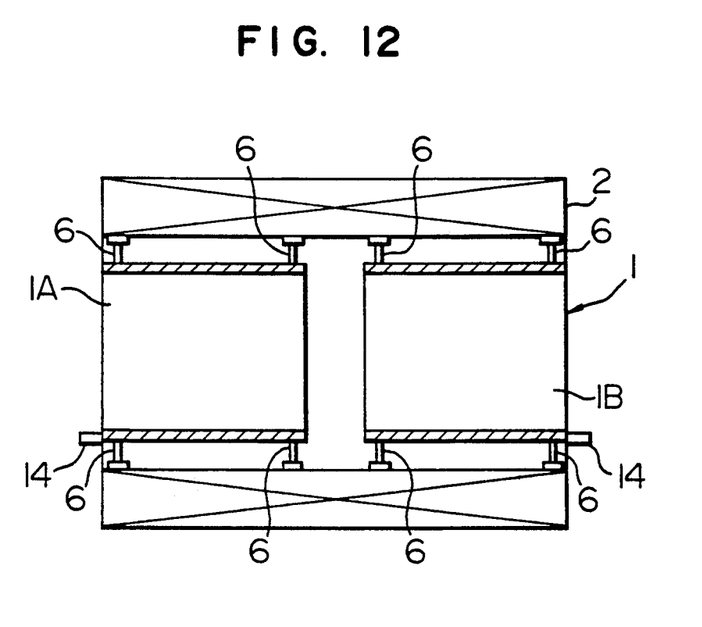
FIG. 12 is a longitudinal sectional view showing an example of a construction of terminal plates for each core of the gradient magnetic field-generating coil assembly according to the invention.

An example of a construction of an electrical system will now be described which is adapted to supply power for generation of gradient magnetic fields to the gradient magnetic field-generating coil assembly of the aforementioned construction according to the invention. As shown in FIG. 12, each of the two divisional cores 1A and 1B is provided with terminal plates 14 for X, Y and Z coils. Thus, the terminal plates 14 are provided separately for the respective cores 1A and 1B. By virtue of this construction, no crossover wiring needs to be established inside the magnet bore between the cores 1A and 1B.

Figure 13:
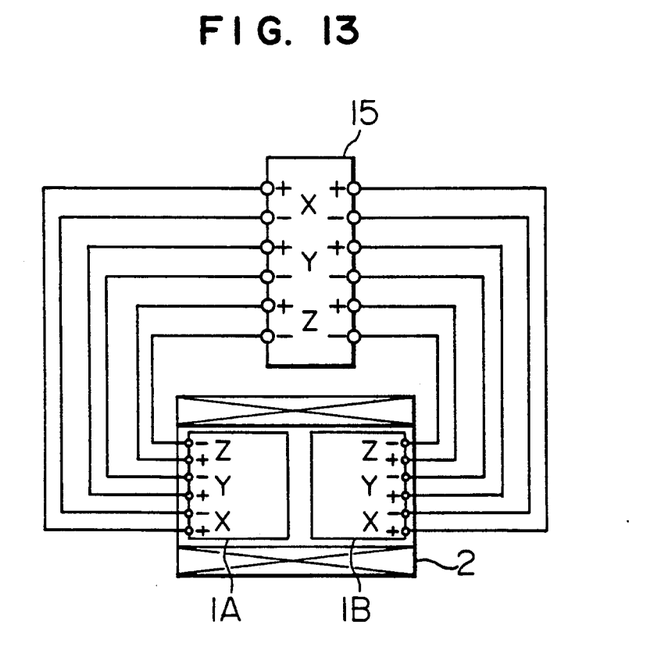
FIG. 13 is a diagram showing an example of a system for feeding power to the gradient magnetic field-generating coil assembly.
Figure 14:
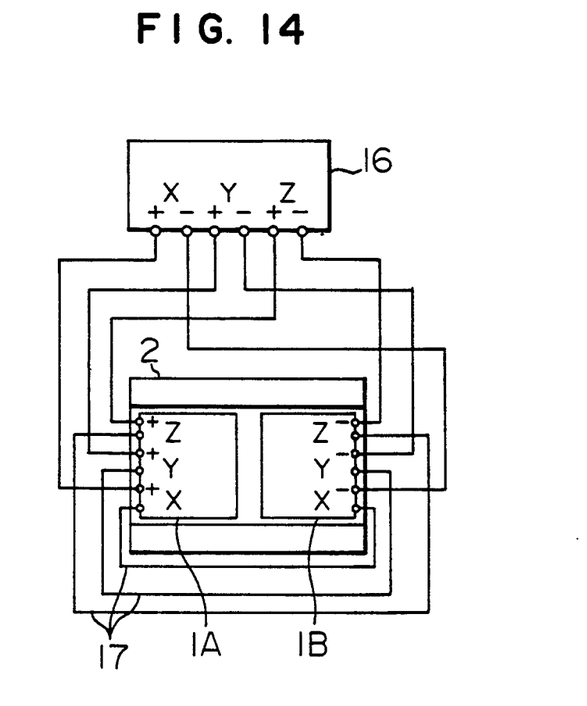
FIG. 14 is a diagram showing another example of the feeding system.

FIGS. 13 and 14 show connection structures of the electrical system. An amplifier 15 has two independent systems which can be provided for respective sets of X, Y and Z channels as shown in FIG. 13 or a power supply wiring as shown in FIG. 14 may be established wherein a power amplifier 16 of one system is used and series wirings are set up exteriorly of the magnet 2 through cables 17.

Figure 15:
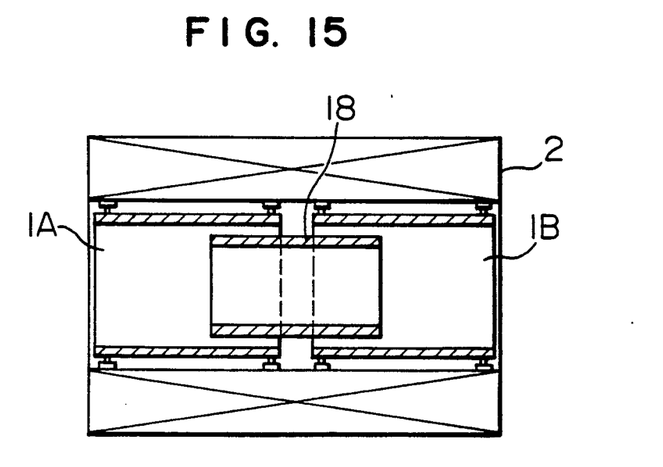
FIG. 15 is a longitudinal sectional view similar to FIG. 2 and showing a further embodiment of the invention.

In an embodiment as shown in FIG. 15, the gap between the cores 1A and 1B is concealed completely with an installation-type radio frequency generating coil 18, for abdomen, installed inside the gradient magnetic field generating coil assembly 1 in such a manner that the esthetic external appearance is not impaired and the previously-described sound reduction effect is not impaired. The radio frequency generating coil 18 is fixedly supported at a central portion of the magnet bore by means of supports not shown.

I claim:

1. A gradient magnetic field-generating coil assembly of an MR imaging apparatus, comprising:
   a core member disposed in a cylindrical magnet bore of a static magnetic field-generating magnet and divided into at least to cores arranged in a longitudinal or cylindrical Z-axis direction of said magnet bore so as to be spaced apart from each other by a predetermined gap; and
   a plurality of gradient magnetic field coils, fixedly carried on said cores, for generating gradient magnetic fields in a cavity of said magnetic bore in three directions which are orthogonal to each other;
   wherein each core has a dominant natural vibration frequency sufficiently high that acoustic resonance does not occur between the cores and the gradient magnetic fields generated by the gradient magnetic field coils.

2. A gradient magnetic field-generating coil assembly according to claim 1, wherein said core member is halved at a central portion of said magnet bore.

3. A gradient magnetic field-generating coil assembly according to claim 2, wherein each of said cores has its fixing portions at its opposite ends.

4. A gradient magnetic field-generating coil assembly according to claim 1, wherein each core is fixed to an inner surface of said magnet bore at only one end portion of each core.

5. A gradient magnetic field-generating coil assembly according to claim 2, further comprising a radio frequency coil for generating uniform radio frequency pulses, a first electrostatic shield for preventing electrostatic coupling between said gradient magnetic field-generating coils and the radio frequency generating coil, and a highly conductive, non-magnetic metal mesh which is formed cylindrically, said first electrostatic shield being located between said cores so as to align with said cores.

6. A gradient magnetic field-generating coil assembly according to claim 5, wherein each of said cores has a second electrostatic shield formed concentrically with said core, said second electrostatic shield being connected to said first electrostatic shield.

7. A gradient magnetic field-generating coil assembly according to claim 6, wherein said first electrostatic shield has a larger diameter than said second electrostatic shield.

8. A gradient magnetic field-generating coil assembly according to claim 7, wherein said first electrostatic shield is mounted closely to an inner surface of said magnet bore.

9. A gradient magnetic field-generating coil assembly according to claim 8, wherein said radio frequency coil has substantially the same diameter as each said core and is disposed in said gap between said cores.

10. A gradient magnetic field-generating coil assembly according to claim 2, further comprising a radio frequency coil located inside said cores so as to overlap at least the gap between said cores.

11. A gradient magnetic field-generating coil assembly according to claim 2, wherein a radio frequency coil is located in said gap between said cores.

12. A gradient magnetic field-generating coil assembly according to claim 1, wherein a first one of said cores is provided with terminals for said gradient magnetic field coils which are independent of terminals provided for a second one of said cores.

13. A method of assembling a gradient magnetic field-generating coil assembly of an MR imaging apparatus, comprising the steps of:
   assembling a plurality of cores such that they are spaced apart from each other by a predetermined distance, by means of coupling members;
   arranging said plurality of cores thus coupled in a longitudinal or cylindrical Z-axis direction within a magnet bore of a magnet for generation of a static magnetic field and mounting the cores temporarily at a predetermined position;
   preliminarily adjusting the cores to align the centers of the static magnetic field and gradient magnetic fields to be generated by the assembly;
   fixing said cores after completion of said preliminary adjustment step; and
   removing said coupling members after completion of the fixing step;
   wherein the assembling step is performed so that each core has a dominant natural vibration frequency sufficiently high that acoustic resonance does not occur between the cores and the gradient magnetic fields.

14. A gradient magnetic field-generating coil assembly according to claim 13, wherein said assembling step is performed so that each core has a dominant natural vibration frequency greater than 1 KHz.

15. A gradient magnetic field-generating coil assembly according to claim 1, wherein each core has a dominant natural vibration frequency greater than 1 KHz.

* * * * *